United States Patent
Jann

(10) Patent No.: US 10,536,118 B2
(45) Date of Patent: Jan. 14, 2020

(54) CIRCUIT AND A METHOD FOR OPERATING A CIRCUIT

(71) Applicant: Intel IP Corporation, Santa Clara, CA (US)

(72) Inventor: Benjamin Jann, Hillsboro, OR (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/937,906

(22) Filed: Mar. 28, 2018

(65) Prior Publication Data

US 2019/0305732 A1 Oct. 3, 2019

(51) Int. Cl.
| | |
|---|---|
| *H03F 3/04* | (2006.01) |
| *H03F 1/30* | (2006.01) |
| *H03G 1/00* | (2006.01) |
| *H03F 1/22* | (2006.01) |
| *H03H 19/00* | (2006.01) |
| *H03D 7/12* | (2006.01) |
| *H03D 9/06* | (2006.01) |

(52) U.S. Cl.
CPC .............. *H03F 1/301* (2013.01); *H03D 7/125* (2013.01); *H03D 9/0675* (2013.01); *H03F 1/223* (2013.01); *H03G 1/0023* (2013.01); *H03G 1/0088* (2013.01); *H03H 19/004* (2013.01)

(58) Field of Classification Search
CPC ... H03F 3/005; H03F 1/56; H03F 3/24; H03F 3/217; H03F 3/189; H04B 1/16

USPC .................................................... 330/9, 311
See application file for complete search history.

(56) References Cited

U.S. PATENT DOCUMENTS

| | | | | |
|---|---|---|---|---|
| 4,628,274 A | * | 12/1986 | Vittoz | H03F 1/303 330/253 |
| 2008/0061858 A1 | * | 3/2008 | Cao | H03F 3/005 327/337 |

OTHER PUBLICATIONS

A Class-G Switched-Capacitor RF Power Amplifier; Sang-Min Yoo et al.; IEEE Journal of Solid-State Circuits, vol. 48, No. 5, May 2013.
A Class-G Voltage-Mode Doherty Power Amplifier; Voravit Vorapipat et al.; 2017 IEEE International Solid-State Circuits Conference.
A Dissertation "Digitally-scalable Transformer-combining Power Amplifier Techniques"; Parmoon Seddighrad; 2012; University of Washington.

* cited by examiner

*Primary Examiner* — Khanh V Nguyen
*Assistant Examiner* — Khiem D Nguyen
(74) *Attorney, Agent, or Firm* — 2SPL Patent Attorneys

(57) ABSTRACT

A circuit containing a first cascode circuit and a second cascode circuit is proposed. The first circuit and the second cascode circuit are stacked between two power supply terminals. An output signal terminal of the circuit is coupled to a node connecting the first cascode circuit and the second cascode circuit. A first signal path is provided between the first cascode circuit and a common ground terminal and a second signal path is provided between the second cascode circuit and the common ground terminal.

20 Claims, 4 Drawing Sheets

CIRCUIT AND A METHOD FOR OPERATING A CIRCUIT

FIELD

Examples relate to a circuit and a method for operating a circuit. Further examples relate to a switching capacitor power amplifier and a mobile device.

BACKGROUND

In wireless systems, power efficiency of a power amplifier may be important. This may especially apply in an average power operating mode in systems with modulation such as orthogonal frequency-division multiplexing (OFDM). Digital power amplifiers (DPA) may enable to provide efficient power amplification and to replace further components provideng needed functions in a transmitter, e.g. digital to analog converter (DAC), filter, or mixer. For example, in mm-wave beamforming systems a digital power amplifier might replace phase shifters and power splitters.

Digital power amplifiers may show reduced efficiency at 6 dB back-off operating point. The circuit design of circuits used to implement the digital power amplifier may be a key driver for improving power efficiency. Other concepts may provide back-off enhancement to improve efficiency at the 6 dB back-off operating point. However, an effectiveness of achieved back-off enhancement may be low. There may be a desire to improve an efficiency of a digital power amplifier.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
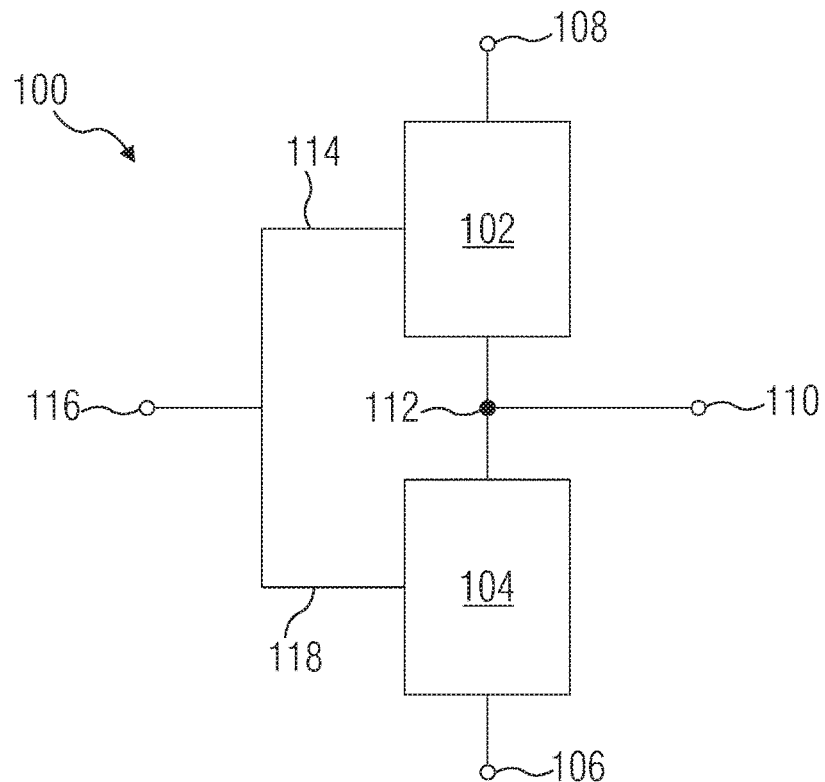
FIG. 1 shows an example of a circuit with two cascode circuits and two signal paths.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

A digital power amplifier (DPA) may comprise a plurality of unit cells. The digital power amplifier can be described as a power amplifier that operates as the combination of the unit cells added in parallel. Each unit cell could be described as a digital inverter that drives a unit capacitor. A digital code or input code of the DPA can be provided to operate a respective unit cell of the DPA in a switching state or in an off-state. An output level of the DPA depends on the number of unit cells with charged unit capacitors. With a larger number of unit cells operated in the switching state are, more power (e.g. radio frequency (RF) power) can be provided by the digital power amplifier.

To improve power efficiency of the digital power amplifier, depending on the design of the DPA it is necessary that unit cells operated in the off-state provide a low impedance connection to a RF signal ground or alternating current (AC) ground of the unit cell. To provide improved power efficiency for digital power amplifiers, circuits and methods for operating said circuits are proposed in the following. The proposed circuits could be implemented in any application and especially may be implemented and used in respective unit cells of digital power amplifiers.

FIG. 1 shows an example of a circuit 100 with two cascode circuits and two signal paths. The circuit 100 comprises a first cascode circuit 102 and a second cascode circuit 104. The two cascode circuits 102, 104 are stacked between two power supply terminals, a first power supply terminal 106 and a second power supply terminal 108. An output signal terminal 110 of the circuit 100 is coupled to a node 112 connecting the first cascode circuit 102 and the second cascode circuit 104. A first signal path 114 of the circuit 100 is provided between the first cascode circuit 102 and a common ground terminal 116. A second signal path 118 of the circuit 100 is provided between the second cascode circuit 104 and the common ground terminal 116.

The circuit 100 may comprise a plurality of transistors. Transistors can be provided at least in the cascode circuits 102, 104 and in the signal paths 114, 118. The transistors are configured to operate the circuit 100 in a switching state or in an off-state, depending on a voltage level applied to the respective terminals of the transistors. Each cascode circuit of the circuit 100 can comprise a plurality of transistors. Transistors may be field effect transistors, e.g. metal oxide semiconductor field effect transistors (MOSFETs). In a switching state (or on-state), a voltage level at the output signal terminal 110 may be high and in an off-state, the voltage level at the output signal terminal 110 may be low. A switching state operation mode could be achieved by applying an input signal to the circuit 100. In the off-state operation mode of the circuit 100, the two signal paths 114, 118 may provide a bypass from the common ground terminal 116 to the output signal terminal 110. A potential at the output signal terminal 110 may equal a potential at the common ground terminal 116 in the off-state.

The circuit comprises the first and second signal path connected in parallel. The electrical impedance between the common ground terminal 116 to the output signal terminal 110 may be reduced by providing two signal paths in parallel. With the parallel connection it is possible to reduce the electrical impedance by 50% compared to a circuit design with only one of the two signal paths between the common ground terminal 116 to the output signal terminal 110, for example.

The circuit 100 could be implemented or provided in a unit cell of a digital power amplifier. The circuit 100 with the stacked cascode circuits 102, 104 may improve an efficiency of a digital power amplifier. Proposed concepts may improve transmitter power efficiency, improving products battery life and improving device thermals. Improved efficiency may be achieved with the proposed circuit 100 by further using power combining and stacking devices and using a higher supply voltage compared to other concepts. Concepts relating to DPAs with a specific circuit topology of the circuit 100 that enables efficiency improvement are described.

Optionally, each cascode circuit 102, 104 of the circuit 100 comprises two transistors. The two transistors can be connected in series. In the first cascode circuit 102, the first transistor of the two transistors may be connected to the second power supply terminal 108 and the second transistor of the two transistors may be connected to the node 112. The terminal of the first transistor connected to the second supply voltage terminal 108 may be a source terminal of the first transistor and the terminal of the second transistor coupled to the node 112 may be a drain terminal of the second transistor. Alternatively, the terminal of the first transistor connected to the second supply voltage terminal 108 may be the drain terminal of the first transistor and the terminal of the second transistor coupled to the node 112 may be the source terminal of the second transistor. Equally, in the second cascode circuit 104, a terminal of a first transistor connected to the first power supply terminal 106 may be a source terminal (or a drain terminal) of the first transistor and a terminal of the second transistor connected to the node 112 may be a drain terminal (or a source terminal, respectively) of the second transistor.

For example, the transistors (e.g. the two transistors) of a cascode circuit may be of a same conductivity type. The transistors of the first cascode circuit 102 may be of a first conductivity type and the transistors of the second cascode circuit 104 may be of a second conductivity type. A conductivity type may indicate whether a transistor is a p-channel or an n-channel transistor. Transistors of the first conductivity type may be n-channel transistors and transistors of the second conductivity type may be p-channel transistors. For example, in the circuit 100 the transistors of the first cascode circuit 102 may be p-MOSFETs and the transistors of the second cascode circuit 104 may be n-MOSFETs. The transistors of the first cascode circuit may be of a different conductivity type compared to the transistors of the second cascode circuit.

In an example of the circuit 100, the first signal path 114 may be coupled to a first node between a first transistor and a second transistor of the first cascode circuit 102. Accordingly, the second signal path 118 may be coupled to a second node between a first transistor and a second transistor of the second cascode circuit 104. For example, the first transistor of each cascode circuit is connected to a respective power supply terminal 106, 108. The first signal path 114 may together with the second transistor of the first cascode circuit 102 provide an electrical connection between the common ground terminal 116 and the output signal terminal 110. Accordingly, the second signal path 118 may together with the second transistor of the second cascode circuit 104 provide a further electrical connection between the common ground terminal 116 and the output signal terminal 110, the further electrical connection providing a parallel path to the electrical connection.

According to an example of the circuit 100, the first signal path may comprise a first switching mode transistor between the first cascode circuit and the common ground terminal and the second signal path may comprise a second switching mode transistor between the first cascode circuit and the common ground terminal. In this example, a signal path between the common ground terminal 116 and the output signal terminal 110 may be provided at least by the first switching transistor and the second transistor of the first cascode circuit. The first and second switching transistors may be respective transistors of a same kind as the transistors of the first and second cascode circuit 100, for example. Accordingly, the transistors of the first cascode circuit may be of the first conductivity type and the first switching transistor may also be of the first conductivity type.

For example, each cascode circuit 102, 104 comprises an input transistor excluded from a signal path between the output signal terminal 110 and the common ground terminal 116. Each cascode circuit may comprise two transistors and one of the transistors may be respectively excluded from the signal path or electrical connection between the output signal terminal 110 and the common ground terminal 116. For example, the excluded transistor can be the transistor of the cascode circuit connected to the respective power supply terminal 106 or 108.

For example, the first transistor of the first cascode circuit is coupled between a first supply voltage terminal and the first node (with a drain or source terminal of the first transistor) and the first transistor of the second cascode circuit is coupled between a second supply voltage terminal and the second node. The gate terminals of the first transistors may constitute input signal terminals of the circuit. In other words, the first signal path 114 may be connected to a node between a first and a second transistor of the cascode circuit 102, and the transistor of the cascode circuit connected to the second power supply terminal 108 or connected between the node and the second power supply terminal 108 can be the input transistor. A gate terminal of the input transistor may constitute an input signal terminal of the circuit. The input transistor may be the transistor, to which an input signal for the circuit can be applied. The input signal may comprise two voltage levels, wherein the first voltage level of the input signal may drive the input transistor so that the circuit 100 is operated in the switching state, and wherein the second voltage level of the input signal may drive the input transistor so that the circuit 100 is operated in the off state. Accordingly, the input transistor of the second cascode circuit 104 may be the transistor of the second cascode circuit 104 connected to the first power supply terminal 106. The circuit 100 may comprise two input transistors, one in the first cascode circuit 102 and one in the second cascode circuit 104. It is possible that the circuit 100 is configured in a way that an input signal can be applied to the two input transistors in differing input signal modes, the two input signals modes possibly differing from each other with respect to their voltage levels.

For example, the first signal path and the second signal path may provide a high frequency bypass of the circuit between the common ground terminal and the output signal terminal in an off-state of the circuit. The common ground terminal may be a radio frequency (RF) terminal of the circuit 100 and the high frequency bypass or a radio frequency bypass of the circuit 100 may be provided between the RF terminal and the output signal terminal of the circuit 100.

Optionally, a capacitance is coupled to the output signal terminal 110. The capacitance or a capacitor may be connected to the node 112 and may be positioned between the node 112 and the output signal terminal 110. The capacitance may be configured to provide a voltage signal of a unit cell of a digital power amplifier, wherein the unit cell comprises the circuit 100. The capacitance may be charged in the switching state. The capacitance coupled to the output signal terminal 110 may enable a high frequency bypass or a low impedance at high frequencies (between the common ground terminal and the output signal terminal) of the circuit 100 in an off-state, and the capacitance may cause an open circuit (between the common ground terminal and the output signal terminal) for a low-frequency signal in the off-state. In an example, the circuit 100 is configured to be operated in a unit cell of a switched capacitor power amplifier. The capacitance may be configured to provide the unit cell capacitor of the unit cell.

Optionally, the circuit design of the circuit 100 may be symmetric. For example, a number of transistors of the first cascode circuit may equal a number of transistors of the second cascode circuit. A source terminal of a transistor of the first cascode circuit may be connected to the second power supply terminal and a source terminal of a transistor of the second cascode circuit may be connected to the first power supply terminal. The transistors of the first and second cascode circuit may differ from each other with respect to their size, their maximum applicable voltage according to their specification and/or their power level by at most 10% (or by at most 5%, or by at most 2%). A circuit layout of the circuit 100 may be symmetric.

In an example, the circuit 100 is configured to be operated at a frequency higher than 0.1 GHz and lower than 100 GHz. The circuit 100 may be configured to be operated at a frequency higher than 1 GHz (or higher than 5 GHz, higher than 10 GHz, higher than 20 GHz or higher than 50 GHz) and/or lower than 80 GHz (or lower than 60 GHz, lower than 40 GHz, lower than 20 GHz or lower than 10 GHz). In one example, the circuit 100 is configured to be operated within a frequency range of 100 MHz at a center frequency of 28 GHz. A detailed design of the circuit 100 may be chosen according to a frequency range provided for operating the circuit 100. It may be possible to select transistors and/or a physical layout of the circuit 100 depending on an intended frequency range of the circuit 100. The frequency range of the circuit 100 may be selected corresponding to an operation frequency of a digital power amplifier with the circuit 100.

To provide improved efficiency, e.g. for a DPA, with the circuit 100 it may be necessary to adequately drive the input terminals of the circuit 100 and apply specific voltage levels. Methods for operating the circuit 100 are proposed below.

Figure 2:
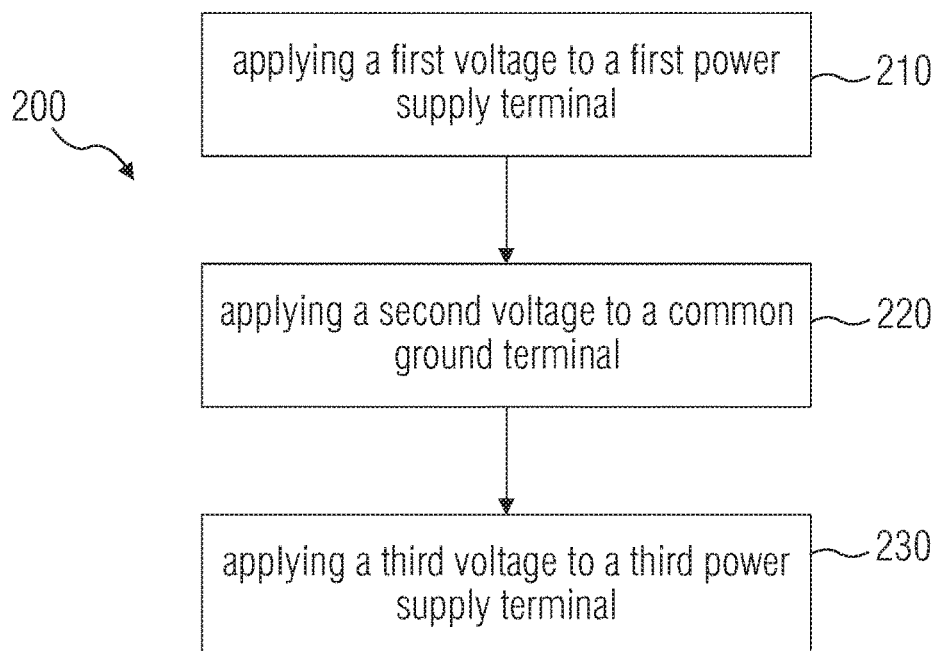
FIG. 2 shows an example of a method for operating a circuit.

FIG. 2 shows an example of a method 200 for operating a circuit. The method 200 for operating the circuit comprises applying 210 a first voltage to a first power supply terminal of the circuit and applying 220 a second voltage to the common ground terminal of the circuit. The method 200 further comprises applying 230 a third voltage to a third power supply terminal, wherein the first, second and third voltage differ from each other. The three voltages may be selected to have different voltage levels. The three voltages may be constant voltages. Any of the previously proposed circuits may be operated according to the method 200. For example, the first voltage may be applied to the first power supply terminal 106 of the circuit 100 and the third voltage may applied to the second power supply terminal 108 according to the circuit 100 shown in FIG. 1. The second voltage may be applied to the common ground terminal 116 of the circuit 100. An electrical potential between the first and second voltage may differ by less than 10% (or less than 5% or less than 2%) from an electrical potential between the second and third voltage.

In an example, the first voltage applied 210 is a reference voltage of the circuit. For example, the reference voltage is applied 210 to the first power supply terminal 106, e.g. a DC (DC: direct current) ground terminal of the circuit 100. The reference voltage may be a supply ground voltage of the circuit 100.

In an example, the electrical potential between the third voltage and the first voltage is at least 95% higher and at most 105% higher than the electrical potential between the second voltage and the first voltage. For example, the third voltage applied to the first second power supply terminal 108 may be twice as high as the second voltage applied to the common ground terminal 116 when a supply ground voltage is applied to the first power supply terminal 106, e.g. the first voltage applied 210 to the first power supply terminal can be 0 V.

In one example, the method 200 comprises operating the circuit 100 in a switching state. The second voltage may be applied 220 to the gate terminals of the transistors of the cascode circuit providing a part of a signal path between the signal output terminal and the common ground terminal (e.g. the second transistors of the cascode circuits). The first voltage may be applied 210 to the gate terminal of the second switching transistor (within the second signal path 118), and the third voltage may be applied 230 to the gate terminal of the first switching transistor (within the first signal path 114).

An example of the method 200 comprises operating the circuit 100 in a switching state. An input signal with an amplitude between the second and the third voltage may be applied to the input signal terminal of the first cascode circuit. A corresponding input signal with an amplitude between the first and the second voltage may be applied to the input signal terminal of the second cascode circuit. The corresponding input signal may equal the input signal with respect to a signal shape. The corresponding input signal may be a second input signal mode of the input signal of the circuit 100.

In one example, method 200 comprises operating the circuit in an off-state. Accordingly, the first voltage may be applied to the gate of the transistor of the cascode circuit providing a part of the first signal path between the signal output terminal and the common ground terminal (e.g. the second transistor of the cascode circuit). The third voltage may be applied to the gate of the transistor of the cascode circuit providing a part of the second signal path between the signal output terminal and the common ground terminal (e.g. the second tansistor of the cascode circuit). The first voltage may be applied to the gate of the first switching transistor, and the third voltage may be applied to the gate of the second switching transistor.

In an example of the method 200, operating the circuit 100 in the off-state, the third voltage may be applied to the input signal terminal of the first cascode circuit, and the first voltage may be applied to the input signal terminal of the second cascode circuit.

Optionally, method 200 may comprise applying a first electrical potential between two terminals of a transistor of the circuit 100, the electrical potential being lower than an electrical potential between the second voltage and the first voltage and/or an electrical potential between the second voltage and the third voltage. The first electrical potential may be applied between all terminals of all transistors of the circuit 100. Applying the first voltage may increase a reliability of the circuit 100. For example, the first electrical potential may describe a specified maximum applicable voltage of the transistors of the circuit 100.

Optionally, the electrical potential between the third voltage and the first voltage may be smaller than 10 V (or smaller than 5 V, smaller than 3 V, or smaller than 2 V) and/or higher than 1 V (or higher than 2 V, or higher than 5 V). For example, the electrical potential between the third voltage and the second voltage (and/or between the second voltage and the first voltage) may be smaller than 5 V (or smaller than 2.5 V, smaller than 1.5 V, or smaller than 1 V) and/or higher than 0.5 V (or higher than 1 V, or higher than 2.5 V).

More details and aspects are mentioned in connection with the embodiments described above or below. The embodiments shown in FIG. 2 may comprise one or more optional additional features corresponding to one or more aspects mentioned in connection with the proposed concept or one or more embodiments described above or below (e.g. in combination with FIGS. 1 and 3-6).

Figure 3:
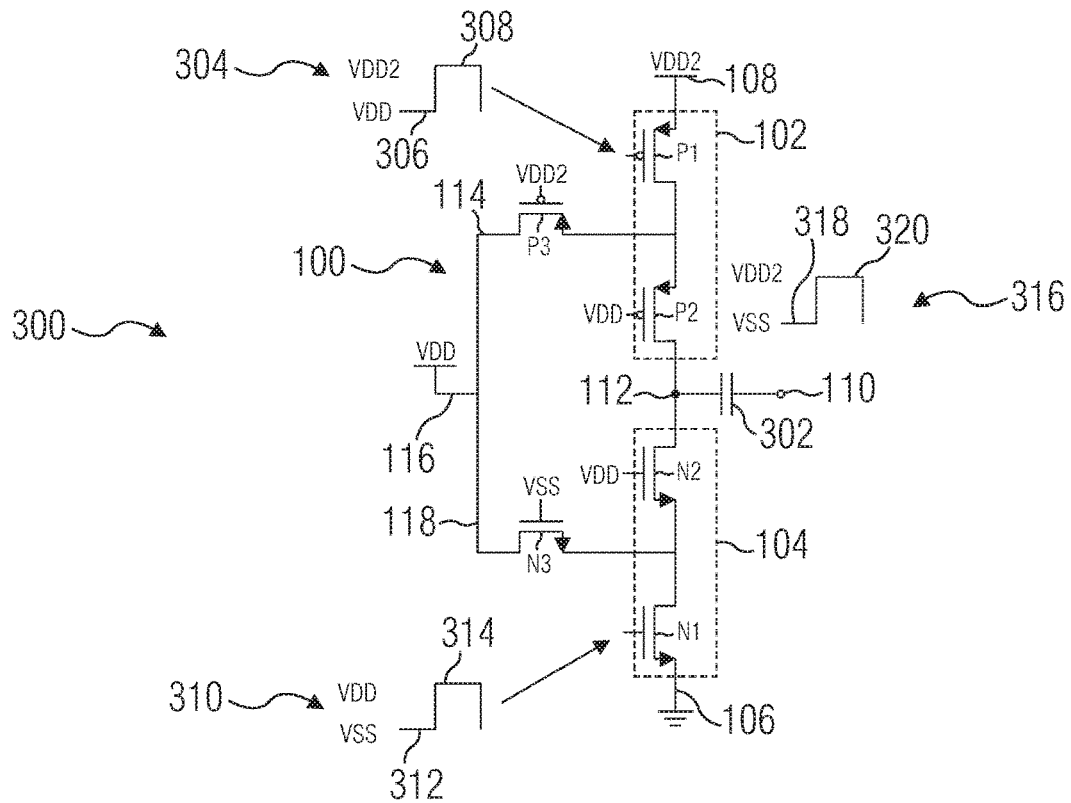
FIG. 3 shows an example of an equivalent circuit of a circuit operated in a switching state.

FIG. 3 shows an example 300 of an equivalent circuit of a circuit 100 operated in a switching state. Example 300 provides elements of the circuit 100 according to FIG. 1. The circuit of example 300 comprises a capacitor 302 connected between the node 112 and the output signal terminal 110. The first cascode circuit 102 comprises a first transistor P1 and a second transistor P2. The source terminal of the first transistor P1 is coupled to the second power supply terminal 108 and the drain terminal of the second transistor P2 is coupled to the node 112. The second cascode circuit 104 comprises a first transistor N1 coupled to the first power supply terminal 106 with a source terminal of the first transistor N1. The second cascode circuit 104 further comprises a second transistor N2 coupled to the node 112 with a drain terminal of the second transistor N2. The transistors of the first cascode circuit may be p-MOSFETs and the transistors of the second cascode circuit may be n-MOSFETs. The first signal path 114 comprises a first switching transistor P3 and the second signal path 118 comprises a second switching transistor N3.

A first voltage may be a ground potential VSS applied to the first power supply terminal 106 and to the gate terminal of the second switching transistor N3. A second voltage is a power supply voltage VDD applied to the common ground terminal 116 and to the gate terminals of the transistors P2 and N2. A third voltage VDD2 is applied to the second power supply terminal 108 and to the gate terminal of the first switching transistor P3. The value of the third voltage VDD2 may be twice as high as the value of the second voltage VDD.

For operating the circuit in the switching state, a first input signal 304 with a lower signal level 306 and a higher signal level 308 can be applied to the gate terminal of the first transistor P1 of the first cascode circuit. Accordingly, a second input signal 310 with a lower signal level 312 and a higher signal level 314 can be applied to the gate terminal of the first transistor N1 of the second cascode circuit. The first transistors N1 and P1 may be the input signal terminals of the circuit 100. The first and second input signal 304, 310 may have the same signal shape, wherein the amplitude of the lower and higher signal levels 306, 308, 312, 314 may differ. For example, the first input signal may swing between a lower level of VDD and a higher level of VDD2. The second input signal may swing between a lower level of VSS and a higher level of VDD.

As a result, an output signal 316 at the output signal terminal 316 may swing depending on a signal level of the input signals 304, 310 between a lower signal level 318 (e.g. with the amplitude VSS) and a higher signal level 320 (e.g. with the amplitude VDD2). The amplitude of the output signal 316 may be at VSS when the amplitude of the first input signal is VDD and the amplitude of the second input signal is VSS. The amplitude of the output signal 316 may be at VDD2 when the amplitude of the first input signal is VDD2 and the amplitude of the second input signal is VDD. The amplitude swing of the output signal 316 can be twice the amplitude swing of the first and second input signal by providing the stacked design of the circuit 100. An electrical potential between two terminals of all transistors P1-P3, N1-N3 of the circuit 100 might not exceed VDD whereas the electrical potential between VSS and VSS2 of the output signal at the output signal terminal of the circuit 100 may be twice the electrical potential VDD.

Figure 4:
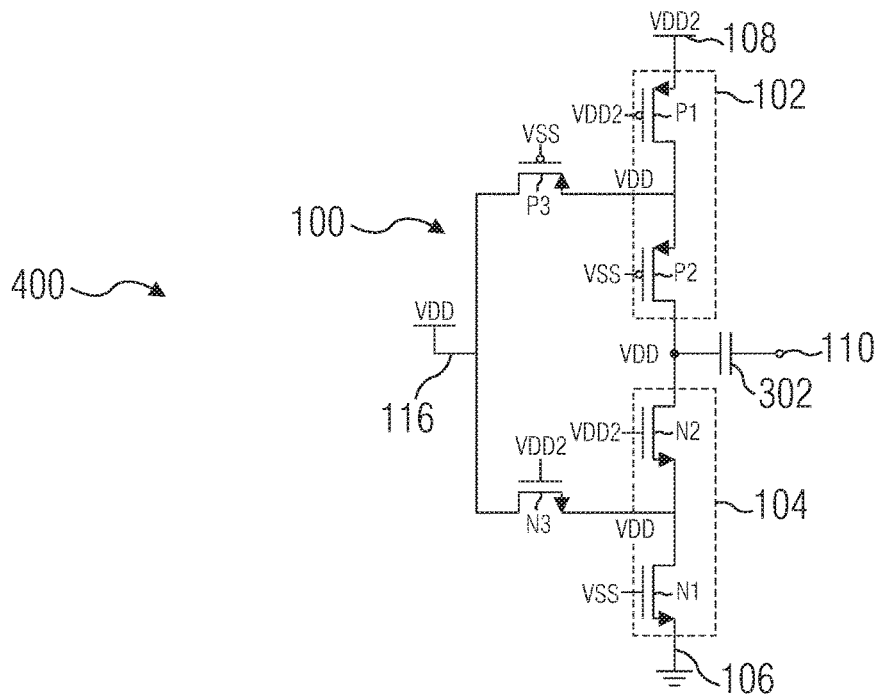
FIG. 4 shows an example of an equivalent circuit of a circuit operated in an off-state.

FIG. 4 shows an example 400 of an equivalent circuit of a circuit operated in an off-state. The elements of the circuit of example 400 are equal to those of the circuit of example 300 shown in FIG. 3. To operate the circuit in the off-state, in contrast to example 300, differing voltages are applied to the terminals. The third voltage VDD2 may be applied to the gate terminal of the second switching transistor N3, and the first voltage VSS (or ground voltage) may be applied to the gate terminal of the first switching transistor P3. The first voltage VSS may be applied to the gate terminal of the second transistor P2 of the first cascode circuit, and the third voltage VDD2 may be applied to the gate terminal of the second switching transistor N3. Instead of applying an input signal at the gate terminals of the first transistors P1 and N1 of the cascode circuits, the third voltage VDD2 may be applied to the gate terminal of the first transistor P1 of the first cascode circuit, and the first voltage VSS may be applied to the gate terminal of the first transistor N1 of the second cascode circuit.

With the applied voltages according to example 400, the circuit 100 may be operated in an off-state. Accordingly, a voltage level at the output signal terminal 110 may be zero or equal the voltage level at the common ground terminal 116 (for example the second voltage VDD). The capacitor 302, the second transistor P2 of the first cascode circuit and the first switching transistor P3 of the first signal path may provide an electrical connection or a signal path between the output signal terminal 110 and that common ground terminal 116. The capacitor 302, the second transistor N2 of the second cascode circuit and the second switching transistor N3 of the second signal path may provide an electrical connection or a further signal path between the output signal terminal 110 and that common ground terminal 116. The signal path and the further signal path connected in parallel between the signal output terminal 110 and the common ground terminal 116 may enable to provide a low off-state impedance of the circuit 100.

The circuit 100 in combination with the examples 300 and 400 shows that in the off-state of the circuit 100 there are two parallel paths to VDD (AC ground) through P3 and N3, halving the on resistance (Ron). Further, all devices (or transistors) that are on receive a full VDD voltage, e.g. the maximum allowed for reliability for their gate source voltage (Vgs), turning on the device hard and further lowering Ron. In the switching state, all transistors might be operated with a maximum potential of VDD across their gate and source (and/or across their drain and source). The circuit 100 may further comprise decoding logic (not shown) implemented to generate electrical signals swinging between 0V and VDD2 and/or 0V and VDD and/or between VDD and VDD2. The generated electrical signals may be applied to respective terminals of the circuit 100 depending on the state in which the circuit 100 is operated.

As already mentioned, the circuit 100 may be provided in a digital power amplifier, e.g. a class-G amplifier and/or a switching capacitor power amplifier. Class-G amplifiers may utilize several power supplies at different voltages. For example three voltage levels may be provided. A switching capacitor power amplifier may enable to increase energy efficiency and linearity. Providing the circuit 100 in unit cells of a switching capacitor power amplifier may enable maximizing efficiency and minimizing reliability concerns due to leakage currents and voltage overstresses.

Power amplifiers with static and constant power supply voltages may exhibit lower efficiency due to their constant supply power. A class-G power amplifier or switching capacitor power amplifier may use multiple power supply voltages and may enable higher efficiency as the static power supply power consumption may be reduced. The optimum supply voltages may depend on a signal power level of the input signal, for example. Multiple supply voltages can be used to create multiple peaks in the overall efficiency characteristic. The efficiency at the 6 dB back off of the power amplifier may be further increased by providing unit cells with the circuit 100.

A switching capacitor power amplifier comprising at least one circuit according to circuits presented above or below is proposed, according to an example. The at least one circuit of the switching capacitor power amplifier may be the circuit 100.

Optionally, the switching capacitor power amplifier may comprise a first array of unit cells. Each unit cell of the switching capacitor power amplifier may comprise at least one circuit according to circuit 100. For example, each unit cell may comprise two circuits, e.g. two circuits 100.

Optionally, the switching capacitor power amplifier may further comprise a second array of unit cells electrically coupled to the first array of unit cells via at least one inductor. For example, a first circuit of a unit cell of the first array may be coupled to a second circuit of a unit cell of the second array via a first inductor, and a second circuit of the unit cell of the first array may be coupled to a first circuit of the unit cell of the second array via a second inductor. The design of the switching capacitor power amplifier may be symmetric and the first and the second array may comprise equal unit cells, for example.

In an example, the switching capacitor power amplifier may be operated in a 6-dB back-off operating mode. An efficiency of the switching capacitor power amplifier in the 6-dB back-off operating mode may be at most 5% (or at most 3% or at most 2%) lower than an efficiency of the switching capacitor power amplifier in a full power operating mode of the switching capacitor power amplifier.

Figure 5A:
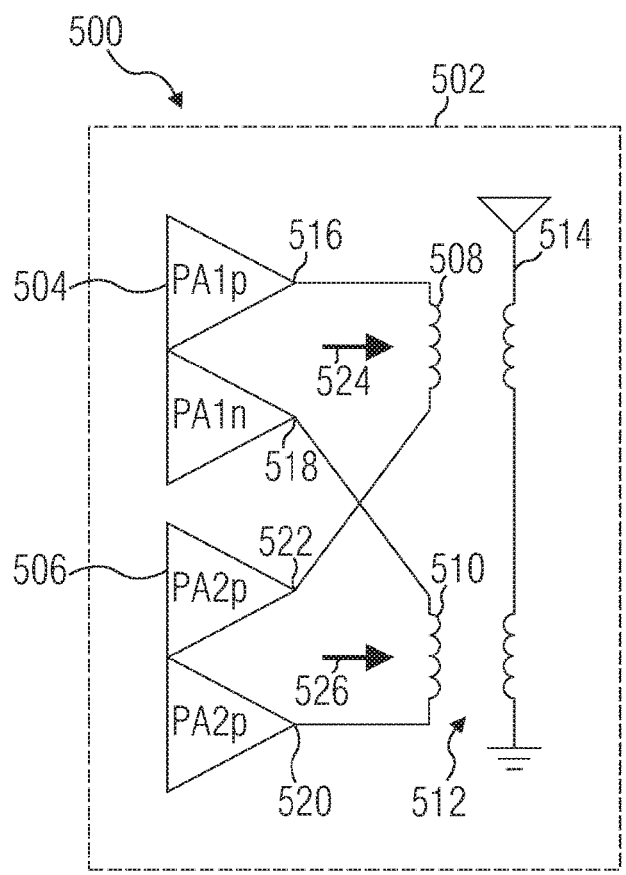
FIGS. 5a, 5b show examples of operating modes of a digital power amplifier.

FIG. 5a shows a first example 500 of a digital power amplifier 502. The digital power amplifier 502 may be a switching capacitor power amplifier or a class G switching capacitor power amplifier. The digital power amplifier 502 may comprise a first array 504 of unit cells and a second a rate 506 of unit cells. The first array and the second array may be electrically connected via a first inductor 508 and a second inductor 510. The first inductor and the second inductor may be parts of a transformer 512, the transformer transmitting an output signal of the digital power amplifier 502 to an output 514 of the digital power amplifier. The arrays of the digital power amplifier may be arranged according to a voltage mode Doherty (VMD) design.

The first array 504 may comprise a first signal output 516 and a second signal output 518, and the second array 506 may comprise a first output 520 and a second signal output 522. The first signal output 516 of the first array 504 may be electrically connected with the second signal output 522 of the second array 506 via the first inductor 508. The first signal output 520 of the second array 506 may be electrically connected with the second signal output 518 of the first array 504 via the second inductor 510. A first electrical impedance 524 at the signal outputs of the first array 504 may be for example 25 Ohms in the first example 500, and a second electrical impedance 526 at the signal outputs of the second array 506 may be for example 25 Ohms as well. In example 500, the digital power amplifier 502 may be operated in a full power operating mode. for example, all unit cells (or the circuits within the unit cells) of the first and second array may be operated in a switching state, providing respective output signals at the output signal terminals of the first and the second array.

Figure 5B:
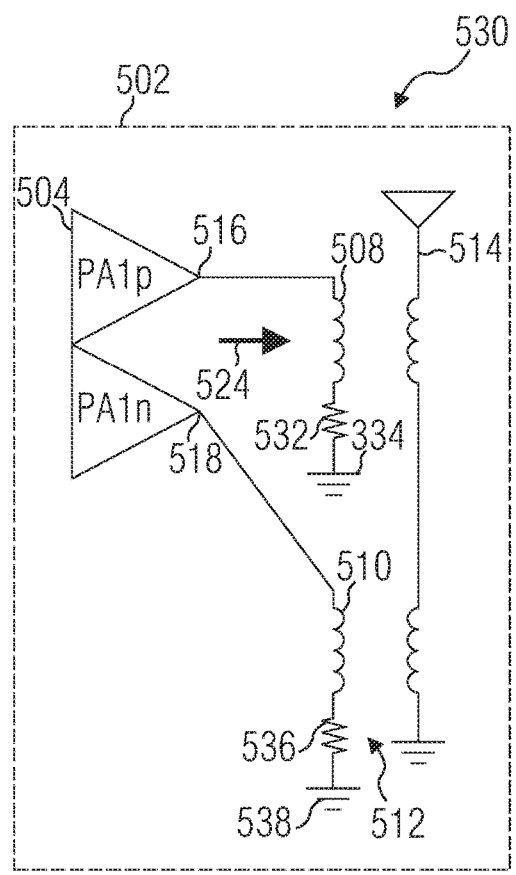

FIG. 5b shows a second example 530 of the digital power amplifier 502. According to example 530, the digital power amplifier 502 may be operated in half power operating mode, or in a 6 dB back-off mode. In half power operating mode, the unit cells (or the circuits within the unit cells) of the first array 504 may be operated in a switching state. By contrast, the unit cells (or the circuits within the unit cells) of the second array 506 (not shown in FIG. 5b) may be operated in an off-state. Therefore, the unit cells of the second array might not provide an output signal but because an off-state impedance with in the digital power amplifier 502. In other words, in half power operating mode, 50% of the unit cells of the digital power amplifier 502 may be switched on and the other 50% of unit cells may be switched of.

A first impedance 532 between the first inductor 508 and an AC ground 534 may be the off-state impedance of a first part of unit cells of the second array 506. A second impedance 536 between the second inductor 510 and an AC ground 538 may be the off-state impedance of a second part of unit cells of the second array 506. As the second array comprises unit cells comprising at least one circuit 100, the off-state impedance of the unit cells is low. Therefore, in example 530, the first impedance 524 at the output signal terminals of the first array may be for example 50 Ohms. A result achieved by the design of the digital power amplifier 502 may be that an efficiency of the digital power amplifier 502 in the 6 dB back-off mode may be increased compared to other digital power amplifiers without the circuit 100.

At full power, the first array and the second array may drive the transformer 512 in antiphase at full amplitude, and the impedance seen by each array may be 25 Ohms. As the unit cells of the second array (e.g. the peaking array) are turned off reducing its output amplitude, the impedance seen by the first array may start to increase until it reaches 50 Ohms (as shown in FIG. 5*b*). Here the second array is completely off, providing efficiency peaking at 6 dB back-off with efficiency enhancement provided by the circuits 100 used in the unit cells of the arrays.

By stacking the first and second array, the supply voltage can be doubled and the output power is increased by 6 dB. Power can be delivered to the load with much less current which reduces losses and increases efficiency.

FIGS. 5*a* and 5*b* show DPA power combining to enhance 6 dB back-off efficiency. In half code (FIG. 5*b*) only the cells in the first array (or DPA1) are in the switching state, whereas in the second array (or DPA2) the unit cells are in the off-state and are represented by resistors to AC ground. As can be seen, these resistors add loss to the transformer coils or inductors 508, 510 and reduce output power and efficiency. The smaller the Ron of the unit cells in off-state, the better the efficiency of the DPA may be for codes or input signals with less than half signal amplitude, e.g. where the DPA may be operating with modulations such as OFDM. Back-off efficiency enhancement may be caused by modulation of the load impedance seen by the DPA with code. At half code only half the DPA is on and the impedance seen by the PA is doubled so that the optimal load-line can be maintained over code.

Further concepts relate to a technique to enhance efficiency at back-off. It is proposed to design the transistors (or devices N1-3 and P1-3 according to e.g. FIG. 3) twice as large in PA1 compared to PA2 (according to the example shown in FIG. 5*b*). This may compensate for losses and maintains a constant code to power gain from half code to full code. The technique may be applied in combination with the proposed concepts shown above and below.

Figure 6:
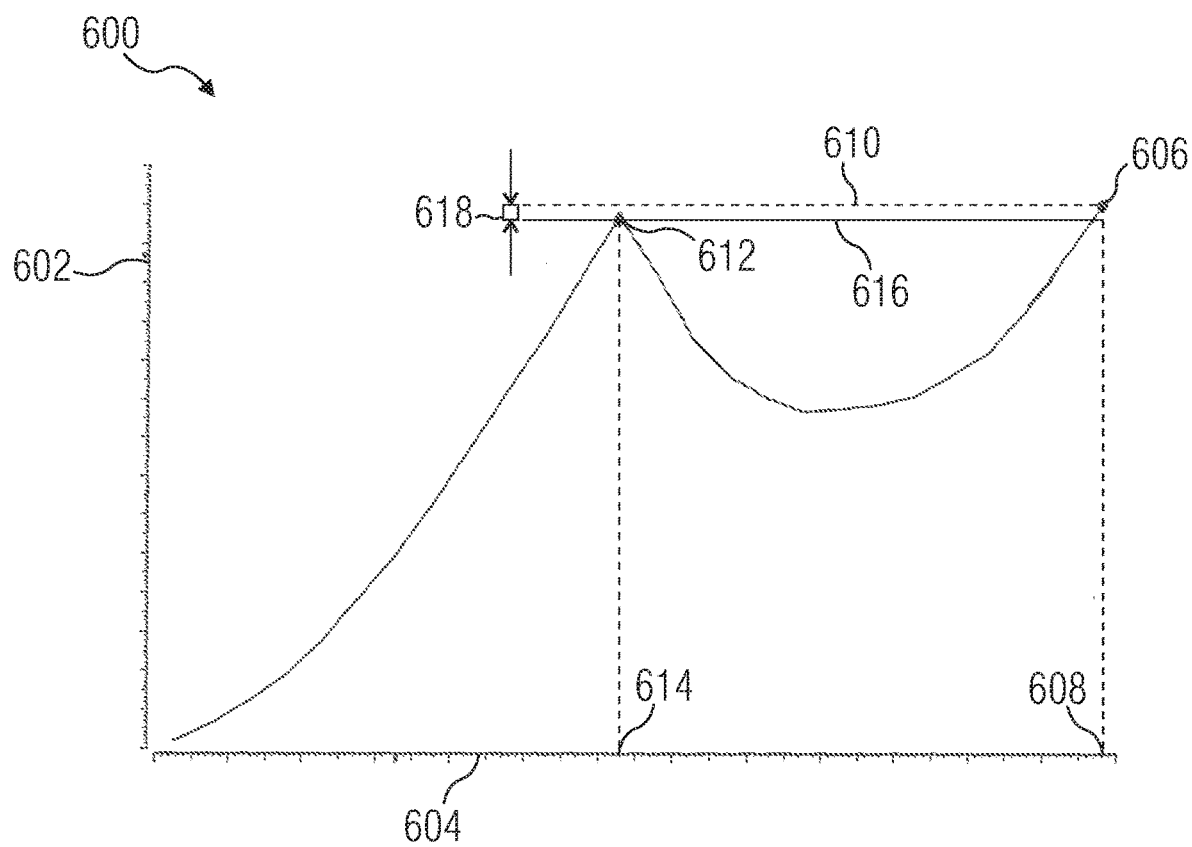
FIG. 6 shows a simulation result for an example of an efficiency of a digital power amplifier.

FIG. 6 shows a result of an example of a circuit simulation 600 of a proposed switched capacitor power amplifier operating at 28 GHz. Power efficiency 602 of the switching capacitor power amplifier is shown for different input codes 604 of the switching capacitor power amplifier. In a full power operation point 606 with a full input code 608 a peak efficiency 610 is achieved by the switching capacitor power amplifier. In a half power operation point 612 with a half input code 614 a second efficiency 616 is achieved. A delta 618 between the peak efficiency 610 and the second efficiency 616 can be low as a result of using the circuit topology of the proposed switching capacitor power amplifier. For example, the second efficiency 616 can be less than 5% (or less than 3% or less than 2%) smaller than the peak efficiency 610. For example, in the circuit simulation 600 an 8 bit DPA is simulated with a full input code of a value of 255 and a half input code of a value of 127. As can be seen from the plot, the full scale efficiency can be almost achieved also at 6 dB back-off or half input code (127 of 255 full scale of an 8 bit DPA).

Further examples relate to a mobile device comprising at least one of the previously proposed circuits, and/or any of the previously proposed switching capacitor power amplifiers. A mobile device may be a mobile phone, a tablet computer, a notebook, a communication device and/or any other mobile consumer device. Providing the circuit and/or the switching capacitor power amplifier in the mobile device may decrease power consumption of the mobile device and may extend a battery life of the mobile device.

Examples relate to a digital power amplifier stacked unit cell with back-off enhancement. To enhance DPA efficiency at back-off, power combining and stacking are proposed in combination with a specific circuit topology that implements lower device Ron (Ron: on-resistance) by maximizing a gate source voltage (Vgs) and using two paths in parallel. This may be achieved while maintaining less than supply voltage (VDD) across all devices at all times for improved reliability.

In the following further examples are proposed.

Example (1) provides a circuit comprising a first cascode circuit and a second cascode circuit stacked between two power supply terminals; an output signal terminal coupled to a node connecting the first cascode circuit and the second cascode circuit; a first signal path between the first cascode circuit and a common ground terminal; and a second signal path between the second cascode circuit and the common ground terminal.

Example (2) shows the circuit according to (1), wherein each cascode circuit comprises a plurality of transistors.

Example (3) provides the circuit according to (1) or (2), wherein each cascode circuit comprises two transistors.

Example (4) provides the circuit according to (3), wherein the first signal path is coupled to a first node between a first transistor and a second transistor of the first cascode circuit and the second signal path is coupled to a second node between a first transistor and a second transistor of the second cascode circuit.

Example (5) provides the circuit according to any of (1) to (4), wherein the first signal path comprises a first switching mode transistor between the first cascode circuit and the common ground terminal and the second signal path comprises a second switching mode transistor between the first cascode circuit and the common ground terminal.

Example (6) provides the circuit according to any of (1) to (5), wherein each cascode circuit comprises an input transistor excluded from a signal path between the output signal terminal and the common ground terminal, wherein a gate terminal of the input transistor constitutes an input signal terminal of the circuit.

Example (7) provides the circuit according to any of (1) to (6), wherein the first transistor of the first cascode circuit is coupled between a first supply voltage terminal and the first node, the first transistor of the second cascode circuit is coupled between a second supply voltage terminal and the second node, wherein the gate terminals of the first transistors constitute input signal terminals of the circuit.

Example (8) provides the circuit according to any of (1) to (7), wherein the first signal path and the second signal path provide a high frequency bypass of the circuit between the common ground terminal and the output signal terminal in an off-state of the circuit.

Example (9) provides the circuit according to any of (1) to (8), wherein a capacitance is coupled to the output signal terminal.

Example (10) provides the circuit according to any of (1) to (9), wherein the transistors of the cascode circuits are field effect transistors.

Example (11) provides the circuit according to any of (1) to (10), wherein the transistors of the first cascode differ from the transistors of the second cascode with respect to their conductivity type.

Example (12) provides the circuit according to any of (1) to (11), wherein the circuit design is symmetric.

Example (13) provides the circuit according to any of (1) to (12), wherein the circuit is configured to be operated in a unit cell of a switched capacitor power amplifier.

Example (14) provides the circuit according to any of (1) to (13), wherein the circuit is configured to be operated at a frequency higher than 0.1 GHz and lower than 100 GHz.

Example (15) provides a method for operating the circuit according to any of the previous examples (1) to (14), the method comprising: applying a first voltage to a first power supply terminal; applying a second voltage to the common ground terminal; and applying a third voltage to a third power supply terminal, wherein the first, second and third voltage differ from each other.

Example (16) provides the method according to (15), wherein the first voltage is a reference voltage of the circuit.

Example (17) provides the method according to (15) or (16), wherein the electrical potential between the third voltage and the first voltage is at least 95% higher and at most 105% higher than the electrical potential between the second voltage and the first voltage.

Example (18) provides the method according to any of (15) to (17), further comprising operating the circuit in a switching state, wherein the second voltage is applied to the gates of the transistors of the cascode circuit providing a part of a signal path between the signal output terminal and the common ground terminal, wherein the first voltage is applied to the gate of the second transistor, and wherein the third voltage is applied to the gate of the first transistor.

Example (19) provides the method according to any of (15) to (18), wherein an input signal with an amplitude between the second and the third voltage is applied to the input signal terminal of the first cascode circuit, and wherein an input signal with an amplitude between the first and the second voltage is applied to the input signal terminal of the second cascode circuit.

Example (20) provides the method according to any of (15) to (17), further comprising operating the circuit in an off-state, wherein the first voltage is applied to the gate of the transistor of the cascode circuit providing a part of the first signal path between the signal output terminal and the common ground terminal, wherein the third voltage is applied to the gate of the transistor of the cascode circuit providing a part of the second signal path between the signal output terminal and the common ground terminal, wherein the first voltage is applied to the gate of the first transistor, and wherein the third voltage is applied to the gate of the second transistor.

Example (21) provides the method according to (20), wherein the third voltage is applied to the input signal terminal of the first cascode circuit, and wherein the first voltage is applied to the input signal terminal of the second cascode circuit.

Example (22) provides the method according to any of (15) to (21), wherein for each transistor of the circuit an electrical potential applied between two terminals of the transistor is lower than an electrical potential between the second voltage and the first voltage.

Example (23) provides the method according to any of (15) to (22), wherein the electrical potential between the third voltage and the first voltage is smaller than 5 V.

Example (24) provides a switching capacitor power amplifier comprising at least one circuit according to any of (1) to (14).

Example (25) provides the switching capacitor power amplifier of (24), the switching capacitor power amplifier comprising a first array of unit cells, wherein each unit cell comprises at least one circuit according to any circuit of (1) to (14).

Example (26) provides the switching capacitor power amplifier of (25), wherein each unit cell comprises a first circuit and a second circuit according to any circuit of (1) to (14).

Example (27) provides the switching capacitor power amplifier according to (25) or (26), further comprising a second array of unit cells electrically coupled to the first array of unit cells via at least one inductor.

Example (28) provides the switching capacitor power amplifier according to any of (25) to (27), wherein a first circuit of a unit cell of the first array is coupled to a second circuit of a unit cell of the second array via a first inductor, and wherein a second circuit of the unit cell of the first array is coupled to a first circuit of the unit cell of the second array via a second inductor.

Example (29) provides the switching capacitor power amplifier according to any of (25) to (27), wherein in a 6-dB back-off operating mode of the switching capacitor power amplifier an efficiency of the switching capacitor power amplifier is at most 2% lower than an efficiency of the switching capacitor power amplifier in a full power operating mode of the switching capacitor power amplifier.

Example (30) provides a mobile device comprising at least one of a circuit according to any circuit of (1) to (14), and a switching capacitor power amplifier according to any of (24) to (28).

Example (31) provides a computer program including program code, when executed, to cause a programmable processor to perform the method of one of examples (15) to (23).

Example (32) provides a non-transitory machine readable storage medium including program code, when executed, to cause a programmable processor to perform the method of one of examples (15) to (23).

Example (33) provides an apparatus comprising means to perform the method of one of examples (15) to (23).

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A circuit for digital power amplifier (DPA) comprising:
    a first cascode circuit and a second cascode circuit stacked between two power supply terminals, wherein the first cascode circuit is coupled to a first power supply terminal and the second cascode circuit is coupled to a second power supply terminal;
    an output signal terminal coupled to a first node connecting the first cascode circuit and the second cascode circuit;
    a first signal path between the first cascode circuit and a common ground terminal; and
    a second signal path between the second cascode circuit and the common ground terminal,
    wherein each cascode circuit comprises at least two transistors,
    wherein the first signal path is coupled to a second node between a first transistor and a second transistor of the first cascode circuit and the second signal path is coupled to a third node between a first transistor and a second transistor of the second cascode circuit, wherein the first transistor of the first cascode circuit and the first transistor of the second cascode circuit are input transistors,
    wherein the circuit for DPA operates either in a switching state where an input signal drives the first and second cascode circuits or in an off state where the input transistors are turned off,
    wherein a low impedance path is formed between the common ground terminal and the output signal terminal in the off state such that a potential at the common ground terminal and a potential at the output signal terminal are substantially same in the off state.

2. The circuit according to claim 1, wherein the first signal path comprises a first switching mode transistor between the first cascode circuit and the common ground terminal and the second signal path comprises a second switching mode transistor between the second cascode circuit and the common ground terminal.

3. The circuit according to claim 1, wherein the input transistors are excluded from a signal path between the output signal terminal and the common ground terminal, wherein a gate terminal of each input transistor constitutes an input signal terminal of the circuit.

4. The circuit according to claim 1, wherein the first transistor of the first cascode circuit is coupled between the first supply voltage terminal and the first node, the first transistor of the second cascode circuit is coupled between the second supply voltage terminal and the second node, wherein gate terminals of the first transistors constitute input signal terminals of the circuit for DPA.

5. The circuit according to claim 1, wherein the first signal path and the second signal path provide a high frequency bypass of the circuit for DPA between the common ground terminal and the output signal terminal in the off state of the circuit for DPA.

6. The circuit according to claim 1, wherein a capacitance is coupled to the output signal terminal.

7. The circuit according to claim 1, wherein the transistors of the first and second cascode circuits are field effect transistors.

8. The circuit according to claim 1, wherein the transistors of the first cascode circuit differ from the transistors of the second cascode circuit with respect to their conductivity type.

9. The circuit according to claim 1, wherein the circuit for DPA is configured to be operated in a unit cell of a switched capacitor power amplifier.

10. The circuit according to claim 1, wherein the circuit for DPA is configured to be operated at a frequency higher than 0.1 GHz and lower than 100 GHz.

11. A method for operating a cascode circuit for digital power amplifier (DPA), the method comprising:
applying a first voltage to a first power supply terminal;
applying a second voltage to a common ground terminal; and
applying a third voltage to a second power supply terminal, wherein the first, second and third voltages differ from each other,
wherein the cascode circuit for DPA comprises:
a first cascode circuit and a second cascode circuit stacked between the first and second power supply terminals, wherein the first cascode circuit is coupled to the first power supply terminal and the second cascode circuit is coupled to the second power supply terminal;
an output signal terminal coupled to a first node connecting the first cascode circuit and the second cascode circuit;
a first signal path between the first cascode circuit and the common ground terminal; and
a second signal path between the second cascode circuit and the common ground terminal,
wherein each cascode circuit comprises at least two transistors,
wherein the first signal path is coupled to a second node between a first transistor and a second transistor of the first cascode circuit and the second signal path is coupled to a third node between a first transistor and a second transistor of the second cascode circuit, wherein the first transistor of the first cascode circuit and the first transistor of the second cascode circuit are input transistors,
wherein the cascode circuit for DPA operates either in a switching state where an input signal drives the first and second cascode circuits or in an off state where the input transistors are turned off,
wherein a low impedance path is formed between the common ground terminal and the output signal terminal in the off state such that a potential at the common ground terminal and a potential at the output signal terminal are substantially same in the off state.

12. The method according to claim 11, wherein the first voltage is a reference voltage of the cascode circuit for DPA.

13. The method according to claim 11, wherein an electrical potential difference between the third voltage and the first voltage is at least 95% higher and at most 105% higher than an electrical potential difference between the second voltage and the first voltage.

14. The method according to claim 11, wherein the second voltage is applied to gates of the second transistors of the first and second cascode circuits in the switching state.

15. The method according to claim 14, wherein an input signal with an amplitude between the second and the third voltage is applied to an input signal terminal of the second cascode circuit, and wherein an input signal with an amplitude between the first and the second voltage is applied to an input signal terminal of the first cascode circuit in the switching state.

16. The method according to claim 11, wherein the first voltage is applied to a gate of the second transistor of the second cascode circuit providing a part of the second signal path between the signal output terminal and the common ground terminal, wherein the third voltage is applied to a gate of the second transistor of the first cascode circuit providing a part of the first signal path between the signal output terminal and the common ground terminal.

17. The method according to claim 16, wherein the third voltage is applied to an input signal terminal of the second cascode circuit, and wherein the first voltage is applied to an input signal terminal of the first cascode circuit.

18. A switching capacitor power amplifier comprising a first array of unit cells, wherein each unit cell comprises at least one circuit according to claim 1.

19. The switching capacitor power amplifier of claim 18 further comprising a second array of unit cells, wherein each unit cell comprises at least one circuit according to claim 1 and wherein the second array of unit cells is electrically coupled to the first array of unit cells via at least one inductor.

20. The switching capacitor power amplifier according to claim 19, wherein in a 6-dB back-off operating mode of the switching capacitor power amplifier an efficiency of the switching capacitor power amplifier is at most 2% lower than an efficiency of the switching capacitor power amplifier in a full power operating mode of the switching capacitor power amplifier.

* * * * *